US005172416A

United States Patent [19]

Allie et al.

[11] Patent Number: 5,172,416

[45] Date of Patent: Dec. 15, 1992

[54] ACTIVE ATTENUATION SYSTEM WITH SPECIFIED OUTPUT ACOUSTIC WAVE

[75] Inventors: Mark C. Allie, Oregon; Larry J. Eriksson; Cary D. Bremigan, both of Madison, all of Wis.

[73] Assignee: Nelson Industries, Inc., Stoughton, Wis.

[21] Appl. No.: 613,102

[22] Filed: Nov. 14, 1990

[51] Int. Cl.[5] ............ H03B 29/00

[52] U.S. Cl. ............ 381/71; 381/72

[58] Field of Search ............ 381/71, 72

[56] References Cited

U.S. PATENT DOCUMENTS

| | | | |
|---|---|---|---|
| 4,654,871 | 3/1987 | Chaplin et al. | 381/72 |
| 4,677,676 | 6/1987 | Eriksson . | |
| 4,677,677 | 6/1987 | Eriksson . | |
| 4,736,431 | 4/1988 | Allie et al. . | |
| 4,815,139 | 3/1989 | Eriksson et al. . | |
| 4,837,834 | 6/1989 | Allie . | |
| 4,953,217 | 8/1990 | Twiney et al. | 381/71 |
| 5,033,082 | 7/1991 | Eriksson et al. | 381/71 |
| 5,105,377 | 4/1992 | Ziegler, Jr. | 381/71 |

OTHER PUBLICATIONS

Number Theory in Science and Communications, Berlin: Springer-Verlag, M. R. Schroeder, 1984, pp. 252-261.

"Adaptive Filters: Structures, Algorithms, and Applications", Michael L. Honig and David G. Messershcmitt, The Kluwer International Series in Engineering and Computer Science, VLSI, Computer Architecture and Digital Signal Processing, 1984.

"Adaptive Signal Processing", Widrow and Stearns, Prentice-Hall, 1985, pp. 349-351.

"Noise Subtracting Filter Study", John Kaunitz and Bernard Widrow, Stanford University, Oct. 3, 1973, pp. 1-27 and 115-121.

*Primary Examiner*—Jin F. Ng

*Assistant Examiner*—Edward Lefkowitz

*Attorney, Agent, or Firm*—Andrus, Sceales, Starke & Sawall

[57] ABSTRACT

An active acoustic attenuation system specifies the error signal (44) to correspondingly specify the output acoustic wave. In the preferred embodiment, the error signal (44) is specified by summing (210) the error signal (44) with a desired signal (204) to provide a specified error signal (206) to the error input (202) of the adaptive filter model (40) such that the model (40) outputs the correction signal (46) to the output transducer (14) to introduce the canceling acoustic wave which specifies the output acoustic wave such that a desired signal is present in the output acoustic wave.

8 Claims, 2 Drawing Sheets

ACTIVE ATTENUATION SYSTEM WITH SPECIFIED OUTPUT ACOUSTIC WAVE

BACKGROUND AND SUMMARY

The invention relates to active acoustic attenuation systems, and provides a system for shaping the attenuation of the output acoustic wave.

The invention particularly arose during continuing development efforts relating to the subject matter shown and described in U.S. Pat. No. 4,677,676, incorporated herein by reference. The invention also arose during continuing development efforts relating to the subject matter shown and described in U.S. Pat. Nos. 4,677,677, 4,736,431, 4,815,139, and 4,837,834, incorporated herein by reference.

Active attenuation involves injecting a canceling acoustic wave to destructively interfere with and cancel an input acoustic wave. In an active acoustic attenuation system, the output acoustic wave is sensed with an error transducer such as a microphone which supplies an error signal to a control model which in turn supplies a correction signal to a canceling transducer such as a loudspeaker which injects an acoustic wave to destructively interfere with and cancel the input acoustic wave. The acoustic system is modeled with an adaptive filter model having a model input from the input transducer such as a microphone, and an error input from the error microphone, and outputting the noted correction signal to the canceling speaker.

In the present invention, the error signal from the error transducer, e.g., error microphone, is specified to correspondingly specify the output acoustic wave.

In the present invention, the error signal is specified by summing the error signal with a desired signal to provide an error signal to the error input of the system model such that the model outputs the correction signal to the output transducer, e.g., speaker, to introduce the canceling acoustic wave such that the desired signal is present in the output acoustic wave. This provides a desired sound other than complete cancellation.

DETAILED DESCRIPTION

Figure 1:
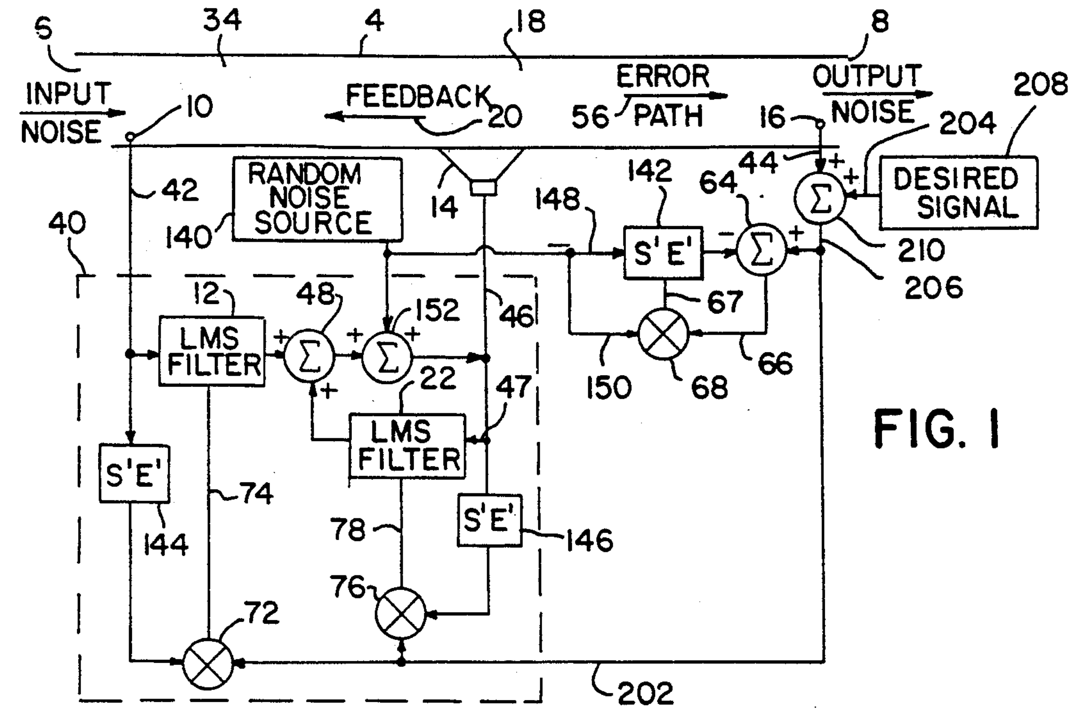
FIG. 1 is a schematic illustration of an active acoustic attenuation system in accordance with the invention.

FIG. 1 shows an active acoustic attenuation system like that shown in FIG. 19 of incorporated U.S. Pat. No. 4,677,676 and uses like reference numerals from FIGS. 19 and 20 of the '676 patent where appropriate to facilitate understanding.

The acoustic system in FIG. 1 has an input 6 for receiving an input acoustic wave and an output 8 for radiating an output acoustic wave. The active acoustic attenuation method and apparatus introduces a canceling acoustic wave from an output transducer, such as speaker 14. The input acoustic wave is sensed with an input transducer, such as microphone 10. The output acoustic wave is sensed with an error transducer, such as microphone 16, providing an error signal 44. The acoustic system is modeled with an adaptive filter model 40 having a model input 42 from input transducer 10 and an error input 202 from error signal 44 and outputting a correction signal 46 to output transducer 14 to introduce the canceling acoustic wave. In the present invention, error signal 44 is modified to correspondingly shape the attenuation of the output acoustic wave.

In one embodiment, error signal 44 is specified by summing the error signal with a desired tone signal 204 to provide a specified error signal 206 to error input 202 such that model 40 outputs correction signal 46 to output transducer 14 to introduce the canceling acoustic wave such that a desired tone is present in the output acoustic wave. The tone signal is generated by tone generator 208, provided by a Hewlett Packard 35660 spectrum analyzer. Summer 210 is provided at the output of error transducer 16 and sums the desired tone signal 204 with error signal 44 and provides the result 206 to the error input 202 of model 40. This specifies the error signal to correspondingly specify the output acoustic wave.

Without tone generator 208 and summer 210, the system operates as described in the incorporated '676 patent and cancels the input acoustic wave such that error signal 44 is zero. With tone generator 208 and summer 210, the tone signal 204 is added or injected into error signal 44, such that model 40 sees a non-zero error signal at error input 202 and in turn acts to inject an acoustic wave at speaker 14 to reduce the error input at 202 to zero. This is accomplished by canceling all of the input acoustic wave except for a tone which is 180° out of phase with tone signal 204. Hence, error microphone 16 senses such remaining tone, which tone appears in error signal 44 and is summed with and 180° out of phase with tone signal 204, thus resulting in a zero error signal 206 which is supplied to the error input 202 of model 40.

In one embodiment, error signal 44 and tone signal 204 are additively summed at summer 206, as shown in FIG. 1. In this embodiment, the tone in the output acoustic wave sensed by microphone 16 will be 180° out of phase with tone signal 204. In another embodiment, error signal 44 and tone signal 204 are subtractively summed at summer 210, in which case the tone in the output acoustic wave sensed by microphone 16 will be in phase with tone signal 204.

Figure 2:
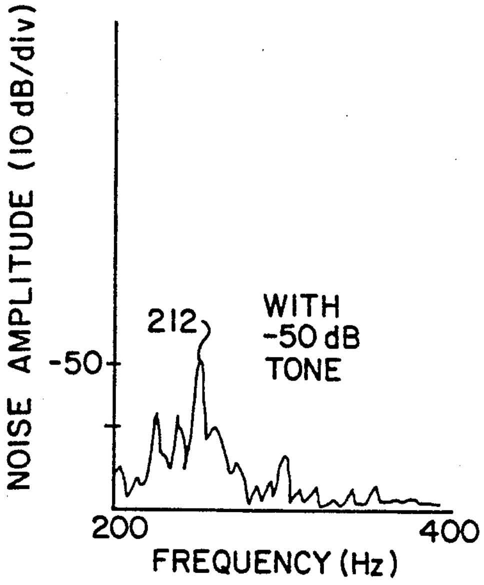
FIGS. 2–5 are graphs illustrating operation of the active acoustic attenuation system in accordance with the invention.
Figure 3:
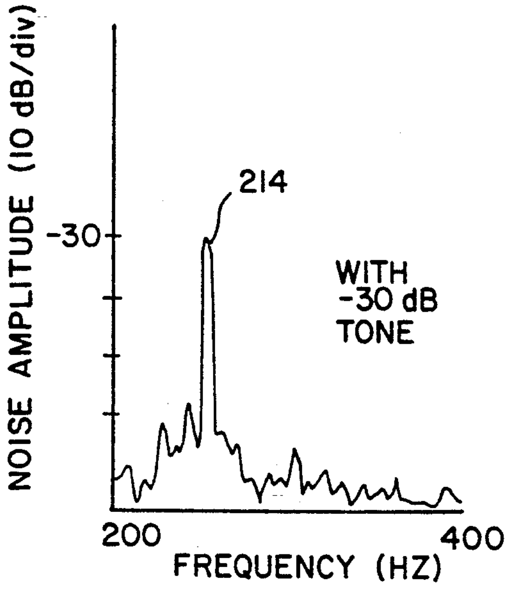
Figure 4:
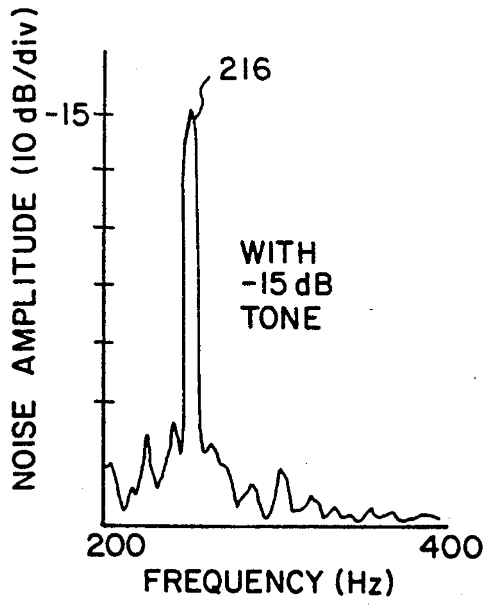
Figure 5:
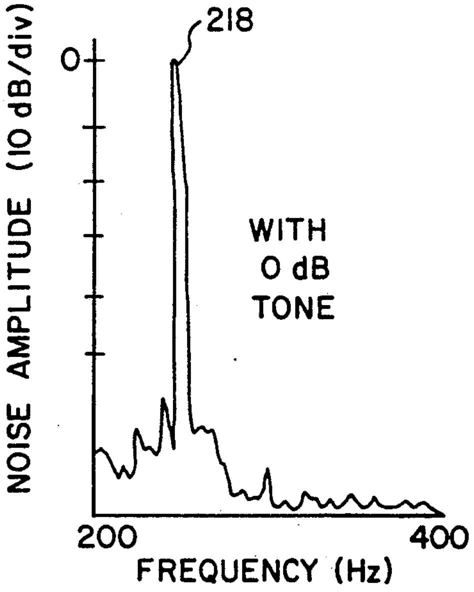

FIGS. 2–5 show shaping of the spectrum of the output acoustic wave provided by the system of FIG. 1 when fully adapted and canceling an undesired input acoustic wave. FIGS. 2–5 are graphs showing frequencies in Hertz on the horizontal axis, and noise amplitude in decibels on the vertical axis, and with increasing amplitudes of injected tones 204 from −50 dB relative to the uncancelled output acoustic wave in FIG. 2, to −30 dB in FIG. 3, to −15 dB in FIG. 4, to 0 dB in FIG. 5. As shown, a small amplitude tone 212, FIG. 2, is present in the output acoustic wave when a small amplitude −50 dB tone 204 is injected. When the amplitude of the injected tone 204 is increased to −30 dB, FIG. 3, the amplitude of the tone in the output acoustic wave also increases, as shown at 214, and continues to increase as shown at 216 and 218, FIGS. 4 and 5, respectively, when the injected tone amplitude is increased to −15 dB and then to 0 dD, respectively. Thus, the tonal content of the output acoustic wave at 8 may be specified through the addition of tone 204. The invention is not limited to a single tone as shown in FIGS. 2–5, but signal generator 208 may be used to create a series of tones.

The system of FIG. 1 is further particularly useful in combination with the system in the above noted '676 patent. The invention provides an active attenuation system and method for attenuating an undesirable output acoustic wave by introducing a canceling acoustic wave from an output transducer such as speaker 14, and for adaptively compensating for feedback along feedback path 20 to input 6 from speaker or transducer 14 for both broad band and narrow band acoustic waves, on-line without off-line pre-training, and providing adaptive modeling and compensation of error path 56 and adaptive modeling and compensation of speaker or transducer 14, all on-line without off-line pre-training.

Input transducer or microphone 10 senses the input acoustic wave at 6. The combined output acoustic wave and canceling acoustic wave from speaker 14 are sensed with an error microphone or transducer 16 spaced from speaker 14 along error path 56 and providing an error signal at 44. The acoustic system or plant P, FIG. 20 of the '676 patent, is modeled with adaptive filter model 40 provided by filters 12 and 22 and having a model input at 42 from input microphone 10 and an error input at 44 from error microphone 16. Model 40 outputs a correction signal at 46 to speaker 14 to introduce canceling sound such that the error signal at 44 approaches a given value, such as zero. Feedback path 20 from speaker 14 to input microphone 10 is modeled with the same model 40 by modeling feedback path 20 as part of the model 40 such that the latter adaptively models both the acoustic system P and the feedback path F, without separate modeling of the acoustic system and feedback path, and without a separate model pre-trained off-line solely to the feedback path with broad band noise and fixed thereto.

An auxiliary noise source 140 introduces noise into the output of model 40. The auxiliary noise source is random and uncorrelated to the input noise at 6, and in preferred form is provided by a Galois sequence, M. R. Schroeder, Number Theory in Science and Communications, Berlin: Springer-Verlag, 1984, pp. 252-261, though other random uncorrelated noise sources may of course be used. The Galois sequence is a pseudorandom sequence that repeats after $2^M-1$ points, where M is the number of stages in a shift register. The Galois sequence is preferred because it is easy to calculate and can easily have a period much longer than the response time of the system.

Model 142 models both the error path E 56 and the speaker output transducer S 14 on-line. Model 142 is a second adaptive filter model provided by a LMS filter. A copy S'E' of the model is provided at 144 and 146 in model 40 to compensate for speaker S 14 and error path E 56.

Second adaptive filter model 142 has a model input 148 from auxiliary noise source 140. The error signal output 44 of error path 56 at output microphone 16 is summed at summer 64 with the output of model 142 and the result is used as an error input at 66 to model 142. The sum at 66 is multiplied at multiplier 68 with the auxiliary noise at 150 from auxiliary noise source 140, and the result is used as a weight update signal at 67 to model 142.

The outputs of the auxiliary noise source 140 and model 40 are summed at 152 and the result is used as the correction signal at 46 to input speaker 14. Adaptive filter model 40, as noted above, is provided by first and second algorithm filters 12 and 22 each having an error input at 44 from error microphone 16. The outputs of first and second algorithm filters 12 and 22 are summed at summer 48 and the resulting sum is summed at summer 152 with the auxiliary noise from auxiliary noise source 140 and the resulting sum is used as the correction signal at 46 to speaker 14. An input at 42 to algorithm filter 12 is provided from input microphone 10. Input 42 also provides an input to model copy 144 of adaptive speaker S and error path E model. The output of copy 144 is multiplied at multiplier 72 with the error signal at 44 and the result is provided as weight update signal 74 to algorithm filter 12. The correction signal at 46 provides an input 47 to algorithm filter 22 and also provides an input to model copy 146 of adaptive speaker S and error path E model. The output of copy 146 and the error signal at 44 are multiplied at multiplier 76 and the result is provided as weight update signal 78 to algorithm filter 22.

Auxiliary noise source 140 is an uncorrelated low amplitude noise source for modeling speaker S 14 and error path E 56. This noise source is in addition to the input noise source at 6 and is uncorrelated thereto, to enable the S'E' model to ignore signals from the main model 40 and from plant P. Low amplitude is desired so as to minimally affect final residual acoustical noise radiated by the system. The second or auxiliary noise from source 140 is the only input to the S'E' model 142, and thus ensures that the S'E' model will correctly characterize SE. The S'E' model is a direct model of SE, and this ensures that the RLMS model 40 output and the plant P output will not affect the final converged model S'E' weights. A delayed adaptive inverse model would not have this feature. The RLMS model 40 output and plant P output would pass into the SE model and would affect the weights.

The system needs only two microphones. The auxiliary noise signal from source 140 is summed at junction 152 after summer 48 to ensure the presence of noise in the acoustic feedback path and in the recursive loop. The system does not require any phase compensation filter for the error signal because there is no inverse modeling. The amplitude of noise source 140 may be reduced proportionate to the magnitude of error signal 66, and the convergence factor for error signal 44 may be reduced according to the magnitude of error signal 44, for enhanced long term stability, "Adaptive Filters: Structures, Algorithms, And Applications", Michael L. Honig and David G. Messerschmitt, The Kluwer International Series in Engineering and Computer Science, VLSI, Computer Architecture And Digital Signal Processing, 1984.

A particularly desirable feature of the invention is that it requires no calibration, no pre-training, no presetting of weights, and no start-up procedure. One merely turns on the system, and the system automatically compensates and attenuates undesirable output noise.

Signal 204 is correlated with the input acoustic wave, preferably by correlating tone generator 208 to the input acoustic wave or by deriving signal 204 from the input acoustic wave or from a synchronizing signal correlated with the input acoustic wave, for example based on rpm. In other applications of the invention, the input microphone is eliminated and replaced by a synchronizing source for the main model 40 such as an engine tachometer. In other applications, directional speakers and/or microphones are used and there is no feedback path modeling. In other applications, a high grade or near ideal speaker is used and the speaker transfer function is unity, whereby model 142 models only the error path. In other applications, the error path transfer function is unity, e.g., by shrinking the error path distance to zero or placing the error microphone 16 immediately adjacent speaker 14, whereby model 142 models only the canceling speaker 14. The invention can also be used for acoustic waves in other fluids (e.g. water, etc.), acoustic waves in three dimensional systems (e.g. room interiors, etc.), and acoustic waves in solids (e.g. vibrations in beams, etc.).

Figure 6:
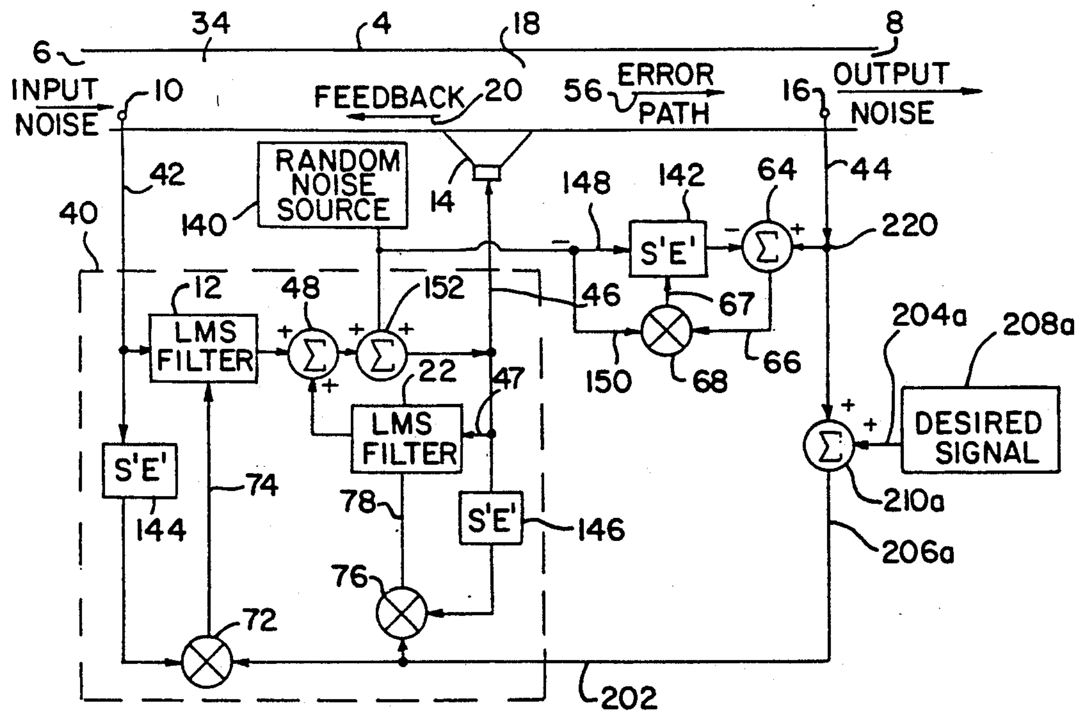
FIG. 6 is like FIG. 1 and shows an alternate embodiment.

FIG. 6 shows an alternate embodiment, and uses like reference numerals from FIG. 1 where appropriate to facilitate understanding. In FIG. 6, error signal 44 is supplied to summer 64 at node 220 before being summed at summer **210*a* with a desired tone signal 204*a* comparable to signal 204. The summing at summer 210*a* specifies the error signal to correspondingly specify the output acoustic wave, as in FIG. 1 at summer 210. Summer 210*a* is provided at the output of error transducer 16 and downstream of node 220 and sums the desired tone signal 204*a* with error signal 44 and provides the resultant specified error signal 206*a* to the error input 202 of model 40 such that model 40 outputs correction signal 46 to output transducer 14 to introduce the canceling acoustic wave such that a desired tone is present in the output acoustic wave. The tone signal is generated by tone generator 208*a*, provided by a Hewlett Packard 35660 spectrum analyzer. The embodiment in FIG. 6 prevents introduction of tone signal 204*a* into summer 64 and the error signal at 66 and model 142**.

It is recognized that various equivalents, alternatives and modifications are possible within the scope of the appended claims.

We claim:

1. In an acoustic system having an input for receiving an input acoustic wave and an output for radiating an output acoustic wave, active attenuation apparatus for attenuating the output acoustic wave by introducing a canceling acoustic wave from an output transducer, comprising:

- an input transducer sensing the input acoustic wave;
- an error transducer sensing the output acoustic wave and providing an error signal;
- an adaptive filter model adaptively modeling said acoustic system and having a model input from said input transducer and an error input from the error signal and outputting a correction signal to said output transducer to introduce the canceling acoustic wave;
- specifying means specifying the error signal to correspondingly specify the output acoustic wave such that a desired component already present in said input acoustic wave remains present in said output acoustic wave and is uncanceled by said canceling acoustic wave, wherein said specifying means comprises a summer summing the error signal with a desired signal and providing the resultant sum to said error input of said model such that said model outputs the correction signal to said output transducer to introduce the canceling acoustic wave and such that said desired signal is present in said output acoustic wave, and comprising a signal generator generating said desired signal, and wherein said summer sums the error signal and said desired signal from said signal generator and supplies the result to said error input of said model.

2. The invention according to claim 1 wherein said desired signal is correlated with said input acoustic wave.

3. The invention according to claim 1 wherein said desired signal is summed only with said error signal, not with said correction signal.

4. An active acoustic attenuation system for attenuating an input acoustic wave comprising an output transducer introducing a canceling acoustic wave to attenuate said input acoustic wave and yield an attenuated output acoustic wave, an error transducer sensing said output acoustic wave and providing an error signal, an adaptive filter model modeling said acoustic system and having an error input from the error signal and outputting a correction signal to said output transducer to introduce the canceling acoustic wave, a summer summing the error signal with a desired signal and providing the resultant sum to said error input of said model such that said model outputs the corrections signal to said output transducer to introduce the canceling acoustic wave and such that said desired signal is present in said output acoustic wave, and comprising a signal generator generating said desired signal, and wherein said summer sums the error signal and said desired signal from said signal generator and supplies the result to said error input of said model.

5. The invention according to claim 4 comprising an auxiliary noise source introducing auxiliary noise into said adaptive filter model, a second adaptive filter model having a model input from said auxiliary noise source and adaptively modeling said output transducer and the error path from said output transducer to said error transducer, a copy of said second adaptive filter model in said first mentioned adaptive filter model, a second summer summing the output of said second adaptive filter model and said error signal and outputting the resultant sum as an error input to said second adaptive filter model.

6. The invention according to claim 5 wherein said second summer sums the output of said second adaptive filter model and said error signal after said summing of said error signal with said desired signal at said first summer.

7. The invention according to claim 5 wherein said second summer sums said output of said second adaptive filter model and said error signal before said summing of said error signal with said desired signal at said first summer.

8. The invention according to claim 5 comprising:

- a third summer summing auxiliary noise from said auxiliary noise source with the output of said first adaptive filter model and supplying the result as the correction signal to said output transducer;
- wherein said first adaptive filter model comprises first and second algorithm means each having an error input from said error transducer;
- a fourth summer summing the outputs of said first and second algorithm means and using the result as an input to said third summer for summing with said auxiliary noise;
- a first copy of said second adaptive filter model of said error path and said output transducer;
- a second copy of said second adaptive filter model of said error path and said output transducer;
- wherein said first copy of said second adaptive filter model has an input from an input to said first algorithm means;
- a first multiplier multiplying the output of said first copy with said first sum and using the result as a weight update signal to said first algorithm means;
- wherein said second copy of said second adaptive filter model has an input from the correction signal;
- a second multiplier multiplying the output of said second copy with said first sum and using the result as a weight update signal to said second algorithm means.

* * * * *